United States Patent
Lin et al.

(10) Patent No.: US 9,356,560 B2
(45) Date of Patent: May 31, 2016

(54) MULTI-MODE INTEGRATED POWER AMPLIFIER

(71) Applicant: QUALCOMM Incorporated, San Diego, CA (US)

(72) Inventors: Saihua Lin, Santa Clara, CA (US); Alan Ngar Loong Chan, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/449,810

(22) Filed: Aug. 1, 2014

(65) Prior Publication Data

US 2016/0036390 A1 Feb. 4, 2016

(51) Int. Cl.

| H04B 1/04 | (2006.01) |
|---|---|
| H03F 3/72 | (2006.01) |
| H03F 1/02 | (2006.01) |
| H03F 3/21 | (2006.01) |
| H03F 3/19 | (2006.01) |
| H04B 1/401 | (2015.01) |

(52) U.S. Cl.
CPC ............... *H03F 1/0277* (2013.01); *H03F 3/19* (2013.01); *H03F 3/211* (2013.01); *H04B 1/401* (2013.01); *H03F 2200/09* (2013.01); *H03F 2203/21142* (2013.01); *H03F 2203/21151* (2013.01)

(58) Field of Classification Search
CPC .... H04B 1/406; H04B 1/0458; H04B 1/0483; H04B 2001/0408; H03F 1/0277; H03F 1/0288; H03F 3/72; H03F 3/189; H03F 3/195; H03F 3/211; H03F 2200/111; H03F 2200/451; H03F 2200/537
USPC .......... 455/127.1, 127.2, 127.3, 127.4, 552.1, 455/553.1; 330/51, 84, 124 R, 295; 375/295
See application file for complete search history.

(56) References Cited

U.S. PATENT DOCUMENTS

| 6,091,966 | A | * | 7/2000 | Meadows | H03F 1/56 455/553.1 |
|---|---|---|---|---|---|
| 6,711,392 | B1 | * | 3/2004 | Gillis | H03F 3/602 455/127.1 |
| 6,756,849 | B2 | | 6/2004 | Dupuis et al. | |
| 6,970,040 | B1 | * | 11/2005 | Dening | H03F 1/0277 330/124 R |
| 7,157,965 | B1 | | 1/2007 | Kim | |
| 8,324,973 | B2 | | 12/2012 | Paul et al. | |
| 8,598,951 | B1 | * | 12/2013 | Hau | H03F 1/0211 330/124 R |
| 8,929,945 | B1 | * | 1/2015 | Wei | H04B 1/0057 455/552.1 |
| 8,957,733 | B2 | * | 2/2015 | Signoff | H03F 1/0277 330/295 |
| 2004/0000952 | A1 | | 1/2004 | Lautzenhiser et al. | |
| 2012/0299657 | A1 | | 11/2012 | Koo et al. | |
| 2014/0002188 | A1 | | 1/2014 | Chen et al. | |
| 2014/0085008 | A1 | | 3/2014 | Cohen et al. | |
| 2014/0097698 | A1 | * | 4/2014 | Wang | H04B 1/0458 330/124 R |

FOREIGN PATENT DOCUMENTS

| EP | 2466748 A1 | 6/2012 |
|---|---|---|
| WO | WO-2013138457 A1 | 9/2013 |

OTHER PUBLICATIONS

International Search Report and Written Opinion—PCT/US2015/039813—ISA/EPO—Sep. 25, 2015.

* cited by examiner

*Primary Examiner* — Quochien B Vuong
(74) *Attorney, Agent, or Firm* — Paradice and Li LLP

(57) ABSTRACT

A method and apparatus are disclosed for transmitting communication signals through a multi-mode power amplifier. For at least some embodiments, a communication signal may be amplified by an amplifier of the multi-mode power amplifier selected based on a desired transmit output power. The output of the selected amplifier may be coupled through a configurable inductive element to an antenna. The inductive element may be configured as a balun or as an inductive load element based on an operating mode of the multi-mode power amplifier.

21 Claims, 6 Drawing Sheets

MULTI-MODE INTEGRATED POWER AMPLIFIER

TECHNICAL FIELD

The present embodiments relate generally to power amplifiers, and specifically to a multi-mode integrated power amplifier.

BACKGROUND OF RELATED ART

A wireless device may send data to other wireless devices by transmitting communication signals carrying encoded data. Transmit output power of the wireless device may vary due to transmitter configuration, proximity of the other wireless devices, and/or other operating conditions. For example, when a first wireless device transmits signals to a relatively nearby second wireless device, a relatively low transmit output power may be used. In contrast, when the first wireless device transmits signals to a relatively distant second wireless device, a relatively high transmit output power may be used. In addition, transmit output power limits may be set forth by specifications such as the IEEE 802.11 specification or a BLUETOOTH® specification from the BLUETOOTH Special Interest Group.

A wireless device may use a power amplifier to amplify the communication signals transmitted to the other wireless devices. Power amplifier efficiency is a measure of the ability of the power amplifier to convert source power (e.g., power supplied to the power amplifier) to transmit output power. Power amplifier efficiency may vary across a range of transmit output power levels. That is, a power amplifier may operate less efficiently at some transmit output power levels than at other transmit output power levels. Inefficient power amplifier operation may generate excessive heat and may reduce battery life of the wireless device.

Thus, there is a need to improve power amplifier efficiency in wireless devices, particularly when transmitting signals with multiple transmit output power levels.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A device and method of transmitting a communication signal via a multi-mode power amplifier is disclosed. In accordance with some embodiments, the multi-mode power amplifier may include a first amplifier, a second amplifier, and an inductive coupler to couple outputs of the first amplifier and the second amplifier to an output of the multi-mode power amplifier. The inductive coupler may include a first inductive element and a second inductive element. The first amplifier may be optimize to operate at relatively low output transmit power levels (e.g., associated with Bluetooth signals), and the second amplifier may be optimize to operate at relatively high output transmit power levels (e.g., associated with Wi-Fi signals). The multi-mode power amplifier may operate in a first mode when signals are to be transmitted according to relatively low output transmit power levels, and may operate in a second mode when signals are to be transmitted according to relatively high output transmit power levels. During the first mode, the first inductive element may be configured to operate as a load inductor that couples the output of the first amplifier to the output of the multi-mode power amplifier, for example, to provide signals amplified by the first amplifier to an antenna for transmission to another device. During the second mode, the first inductive element may be configured to operate as a balun that couples the output of the second amplifier to the output of the multi-mode power amplifier, for example, to provide signals amplified by the second amplifier to the antenna for transmission to another device.

In accordance with other embodiments, a wireless communication device may include a first transceiver coupled to a multi-mode power amplifier. The multi-mode power amplifier may include a first amplifier, a second amplifier, and an inductive coupler. The inductive coupler may include a first inductive element and a second inductive element. The first inductive element may be configured to operate as a balun to couple the second amplifier to the output of the multi-mode power amplifier.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

The present embodiments are described below in the context of Wi-Fi enabled devices for simplicity only. It is to be understood that the present embodiments are equally applicable for devices using signals of other various wireless standards or protocols. As used herein, the terms "wireless local area network (WLAN)" and "Wi-Fi" may include communications governed by the IEEE 802.11 standards, BLUETOOTH®, HiperLAN (a set of wireless standards, comparable to the IEEE 802.11 standards, used primarily in Europe), and other technologies used in wireless communications.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figure 1:
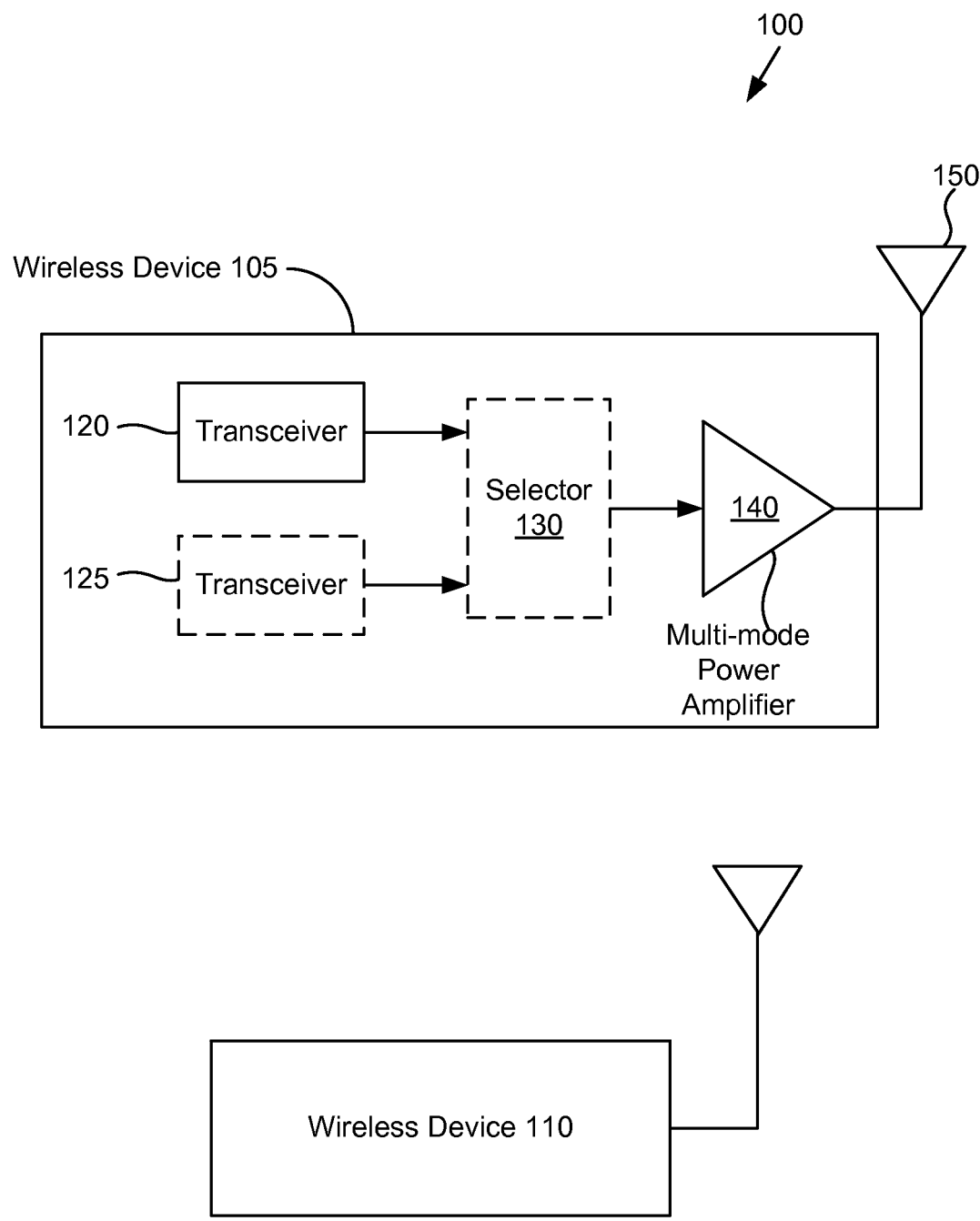
FIG. 1 depicts an example wireless system within which the present embodiments may be implemented.

FIG. 1 depicts an example wireless system 100 within which the present embodiments may be implemented. Wireless system 100 includes wireless devices 105 and 110. Although only two wireless devices 105 and 110 are shown for simplicity, wireless system 100 may include any number of wireless devices. Communication signals may be transmitted between wireless devices 105 and 110.

Wireless device 105 may include transceiver 120, multi-mode power amplifier 140, and antenna 150. Transceiver 120 may generate communication signals according to a communication protocol such as, but not limited to, Wi-Fi, BLUETOOTH, near-field communication, Zig-Bee, or any other feasible communication protocol. Communication signals from transceiver 120 are provided to multi-mode power amplifier 140. Multi-mode power amplifier 140 may amplify the communication signals based, at least in part, on a desired transmit output power. Amplified communication signals are provided from multi-mode power amplifier 140 to antenna 150.

In some embodiments, wireless device 105 may include an additional transceiver 125 and a selector 130. Transceiver 125 may generate communication signals according to a different communication protocol, compared to transceiver 120. For example, transceiver 120 may generate Wi-Fi communication signals while transceiver 125 may generate BLUETOOTH communication signals. Selector 130 may couple transceiver 120 and/or transceiver 125 to multi-mode power amplifier 140. In some embodiments, transceiver 125 and selector 130 may be optional within wireless device 105. In some embodiments, wireless device 105 may include three or more transceivers. Wireless device 110 may include one or more transceivers, a selector, and a multi-mode power amplifier (not shown for simplicity) similar to those depicted in wireless device 105.

Figure 2:
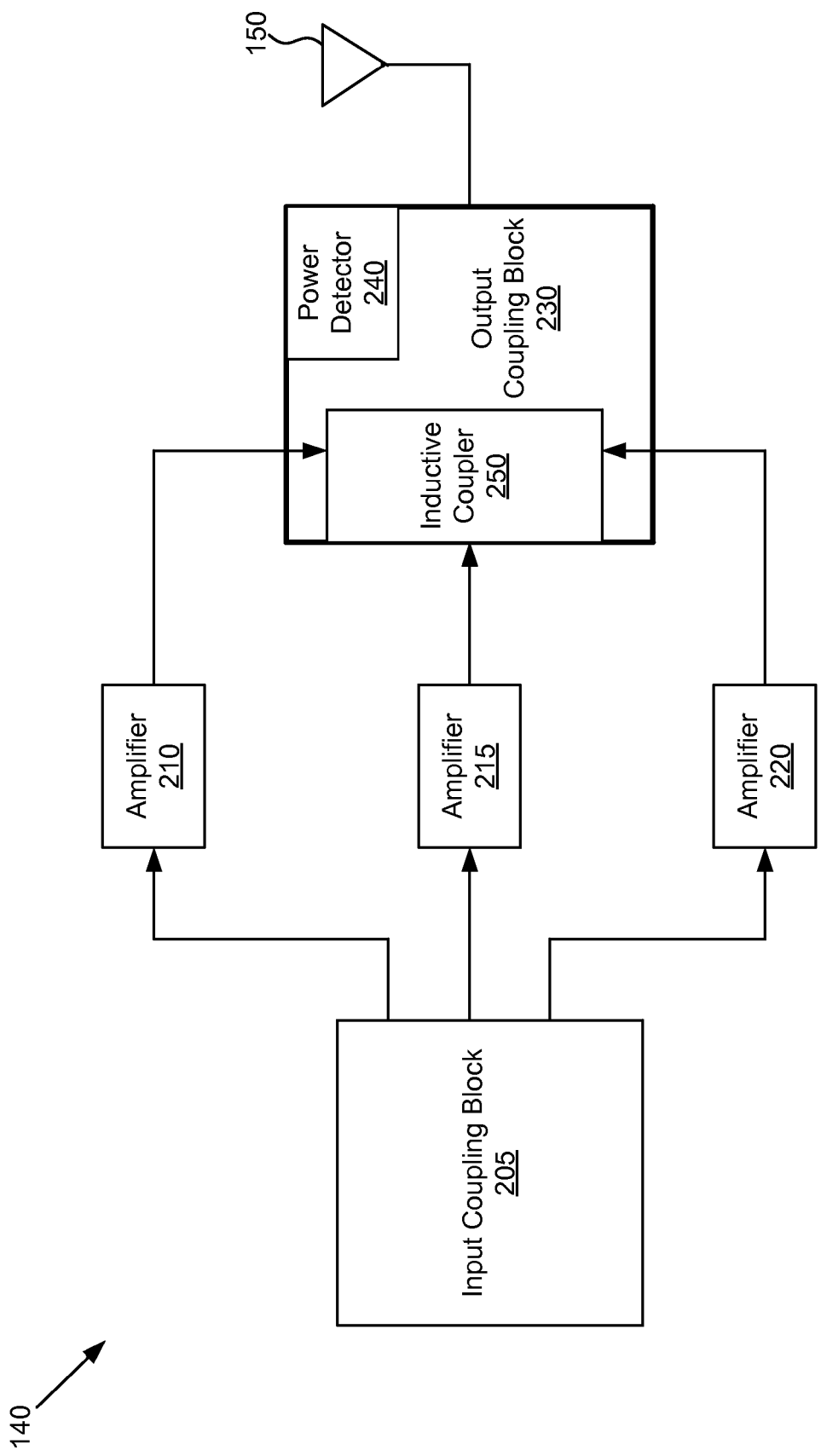
FIG. 2 shows an example embodiment of a multi-mode power amplifier.

FIG. 2 shows an example embodiment of multi-mode power amplifier 140 of FIG. 1. Multi-mode power amplifier 140 includes input coupling block 205, amplifiers 210, 215, and 220, and output coupling block 230. Other embodiments of multi-mode power amplifier 140 may include other numbers of amplifiers such as two amplifiers or more than two amplifiers. Each amplifier 210, 215, and 220 may be designed and/or optimized for a particular range of transmit output power. For example, amplifier 210 may be designed for relatively low transmit output power levels, such as transmit output power levels less than or equal to 5 dBm. In some embodiments, relatively low transmit output power levels may be suitable for BLUETOOTH signals. Amplifier 215 may be designed for relatively moderate transmit output power levels, such as transmit output power levels greater than 5 dBm and less than or equal to 14 dBm. Amplifier 220 may be designed for relatively high transmit output power levels, such as transmit output power levels greater than 14 dBm. In some embodiments, relatively moderate and high transmit output power levels may be suitable for Wi-Fi signals.

Input coupling block 205 couples a communication signal (e.g., a communication signal to be transmitted to another wireless device) to amplifiers 210, 215, and 220. In some embodiments, input coupling block 205 may selectively couple the communication signal to one of amplifiers 210, 215, and 220. In other embodiments, input coupling block 205 may couple the communication signal to all amplifiers 210, 215, and 220 in parallel. Input coupling block 205 may provide impedance matching functionality between an input impedance of the multi-mode power amplifier 140 and amplifiers 210, 215, and 220. Input impedance matching via input coupling block 205 is discussed below in conjunction with FIG. 3.

Output coupling block 230 may couple outputs of amplifiers 210, 215, and 220 to an output of multi-mode power amplifier 140. In some embodiments, the output of the output coupling block 230 is the output of multi-mode power amplifier 140 and is coupled to antenna 150. Output coupling block 230 may include an inductive coupler 250 to couple outputs of amplifiers 210, 215, and 220 to the input of output coupling block 230. Inductive coupler 250 may also provide output impedance matching functionality between outputs of amplifiers 210, 215, and 220 and an output impedance of multi-mode power amplifier 140. Output impedance matching via inductive coupler 250 is discussed below in conjunction with FIG. 3.

Multi-mode power amplifier 140 may select one of amplifiers 210, 215, and 220 to amplify the communication signal based, at least in part, on the desired transmit output power. For example, BLUETOOTH communication signals may have a relatively low desired transmit output power. Amplifier 210 may be optimized for relatively low transmit output power. Thus, if multi-mode power amplifier 140 is coupled to a BLUETOOTH transceiver, then input coupling block 205 may couple an associated BLUETOOTH communication signal to amplifier 210. In another example, a Wi-Fi communication signal may have a relatively moderate desired transmit output power. Amplifier 215 may be optimized for moderate transmit output power. Thus, if multi-mode power amplifier 140 is coupled to a Wi-Fi transceiver, then input coupling block 205 may couple a Wi-Fi communication signal to amplifier 215.

In some embodiments, output coupling block 230 may include a power detector 240 to detect and/or measure transmit output power levels of multi-mode power amplifier 140. That is, power detector 240 may detect and/or measure transmit output power levels of amplifiers 210, 215, and 220 included in multi-mode power amplifier 140. In some embodiments, power detector 240 may be coupled to inductive coupler 250. Transmit signals from amplifiers 210, 215, and 220 may be coupled through inductive coupler 250 to power detector 240. Power detector 240 may detect when amplifiers 210, 215, and 220 are transmitting signals through inductive coupler 250. Additionally, in some embodiments, power detector 240 may measure transmit output power levels associated with amplifiers 210, 215, and 220.

Figure 3:
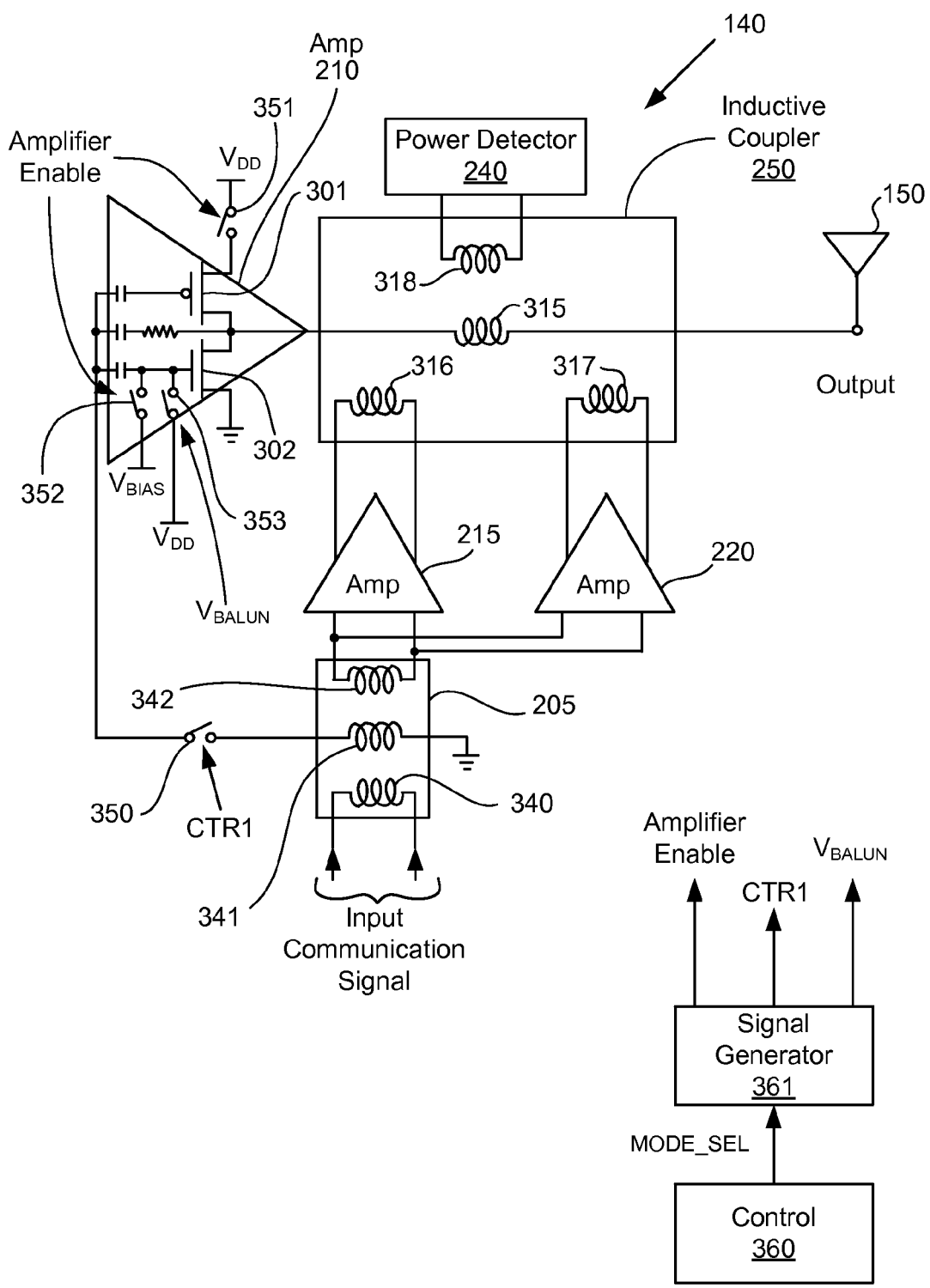
FIG. 3 shows another example embodiment of a multi-mode power amplifier.

FIG. 3 shows another example embodiment of multi-mode power amplifier 140. Multi-mode power amplifier 140 includes amplifiers 210, 215, and 220, inductive coupler 250, power detector 240, and input coupling block 205. Communication signals provided to multi-mode power amplifier 140 are received by input coupling block 205 and are provided to amplifiers 210, 215, and 220. Outputs of amplifiers 210, 215, and 220 are coupled to inductive coupler 250.

Input coupling block 205 may couple communication signals to amplifiers 210, 215, and 220 via inductors 340-342. In some embodiments, a switch 350 may be used to isolate inductor 341 from amplifier 210, for example, in response to a first control signal CTR1. Input coupling block 205 may also provide impedance matching functionality between an input impedance of the multi-mode power amplifier 140 and an input impedance of amplifiers 210, 215, and 220. Thus, in some embodiments, an impedance of inductors 340-342 may be selected to match the input impedance of multi-mode power amplifier 140. For example, if the input impedance of multi-mode power amplifier 140 is 50 ohms, the impedance of inductor 340 may be selected to be 50 ohms. The impedance of inductor 340 may be determined, at least in part, by the inductance of inductor 340. Thus, the impedance of inductor 340 may be determined by inductor characteristics such as, for example, conductor trace width and/or a number of loops or turns of the conductor used to construct inductor 340. In a similar manner, the impedance of inductors 341 and 342 may also be selected to match the input impedance of amplifiers 210, 215, and 220.

Inductive coupler 250 includes inductors 315-318. Inductors 315-317 are coupled to amplifiers 210, 215, and 220, respectively. Inductor 318 is coupled to power detector 240. Inductor 315 may function as an output (e.g., load) inductor for amplifier 210 or as a balun. When inductor 315 functions as an output or load inductor (e.g., during the first mode), amplified communication signals from amplifier 210 may be provided to antenna 150 via inductor 315 for transmission to another device. When inductor 315 functions as a balun (e.g., during the second mode), amplified communication signals from amplifiers 215 and 220 may be coupled from inductors 316 and 317, respectively, to inductor 315 and provided as an output signal to antenna 150 for transmission to another device.

As described above, each amplifier 210, 215, and 220 may be designed to efficiently operate within a predefined range of transmission output power levels. For example, amplifier 210 may be an inverting amplifier designed to efficiently operate at relatively low transmit output power levels (e.g., transmit output power levels suitable for BLUETOOTH signals). Amplifiers 215 and 220 may be designed to efficiently operate at relatively moderate and high transmit output power levels (e.g., transmit output power levels suitable for Wi-Fi signals), respectively. Amplifier 210 is depicted in FIG. 3 as an inverting amplifier and includes output transistors 301 and 302. In some embodiments, when amplifier 210 is operating in a first mode as an inverting amplifier, a switch 351 may couple the drain of transistor 301 to a supply voltage (e.g., $V_{DD}$), and a switch 352 may couple a bias voltage ($V_{BIAS}$) to the gate of transistor 302. Switch 351 and switch 352 may be controlled by an amplifier enable signal. In some embodiments, the amplifier enable signal may be based, at least in part, on the operational mode of amplifier 140, and may be generated by a hardware or firmware based controller or by a processor executing a software program or routine. For at least some embodiments, the amplifier enable signal may be generated by a signal generator 361 in response to a mode select signal (MODE_SEL), as described in more detail below.

In some embodiments, amplifier 210 may determine when inductor 315 functions as an output inductor or as a balun. For example, when amplifier 210 is operating in the first mode, transistors 301 and 302 may provide an output signal to inductor 315, which operates as an output inductor. When amplifier 210 is operating in the second mode, a $V_{BALUN}$ signal may control switch 353. Switch 353 may couple a voltage, such as a supply voltage ($V_{DD}$) to the gate of transistor 302. The supply voltage may cause transistor 302 to turn on and couple a terminal of inductor 315 to a first reference voltage, such as ground potential. When the terminal of inductor 315 is coupled to the first reference voltage, inductor 315 may function as a balun and may be inductively coupled to inductor 316 and/or inductor 317. In this manner, inductor 315 may receive amplified communication signals from amplifier 215 and/or 220 via inductor 316 and/or inductor 317, respectively. In some embodiments, when amplifier 210 is operating in the second mode, the amplifier enable signal may cause switch 351 to turn off and de-couple the drain of transistor 301 from $V_{DD}$, may cause switch 352 to turn off and isolate the gate of transistor 302 from $V_{BIAS}$, and may cause switch 353 to turn off and couple the gate of transistor 302 to $V_{DD}$ (e.g., thereby maintaining transistor 302 in a conductive state). The $V_{BALUN}$ signal may be based, at least in part, on the operational mode of amplifier 140, and may be generated by hardware, firmware and/or software program or routine. For at least some embodiments, the $V_{BALUN}$ signal signal may be generated by signal generator 361 in response to the MODE_SEL signal, as described in more detail below.

In some embodiments, multi-mode power amplifier 140 may include a control block 360 and signal generator 361. Control block 360 may generate the MODE_SEL signal to cause the multi-mode power amplifier 140 to operate in the first mode or the second mode, as described above. In some embodiments, control block 360 may provide the MODE_SEL signal to operate the multi-mode power amplifier 140 in the first mode when the desired transmit output power is less than a threshold. In another embodiment, control block 360 may provide the MODE_SEL signal to operate the multi-mode power amplifier 140 in the second mode when the desired transmit output power is greater than a threshold. Signal generator 361 may receive the MODE_SEL signal and, in response thereto, may generate the amplifier enable signal, the CTR1 signal, and the $V_{BALUN}$ signal. For at least some embodiments, generation of the MODE_SEL signal may be based, at least in part, on a desired output transmit power level. For at least one embodiment, the desired output transmit power level may be based upon whether amplifier 210 is active or amplifiers 215/220 are active. For at least another embodiment, the desired output transmit power level may be based upon whether Bluetooth signals or Wi-Fi signals are to be transmitted from the device via antenna 150. Thus, the MODE_SEL signal may be generated in response to activity levels of amplifiers 210, 215, and 220, in response to activity levels of transceivers 120 and 125 (see also FIG. 1), and/or based upon a protocol type (e.g., Bluetooth or Wi-Fi) of the communication signal to be transmitted to another device. A possible relationship between the first and the second mode, the function of inductor 315, the states of switches 351-353, and possible output transmit power levels is shown below in Table 1.

TABLE 1

| Mode | Inductor 315 function | Switch 350/351/352 | Switch 353 | Transmit Power |
|---|---|---|---|---|
| 1 | Output Inductor | Closed | Open | Low |
| 2 | Balun | Open | Closed | Moderate/High |

Similar to input coupling block 205, inductive coupler 250 may provide impedance matching functionality between output impedances of amplifiers 210, 215, and 220 and an output impedance of multi-mode power amplifier 140. Thus, in some embodiments, inductors 315-317 may be selected to have an impedance to match amplifiers 210, 215, and 220, respectively. In some embodiments, inductor 318 may be inductively coupled to inductors 315-317. Thus, power detector 240 may detect and/or measure transmit output power levels associated with amplifiers 210, 215, and 220 via an inductive coupling between inductor 318 and inductors 315, 316, and 317, respectively.

Figure 4:
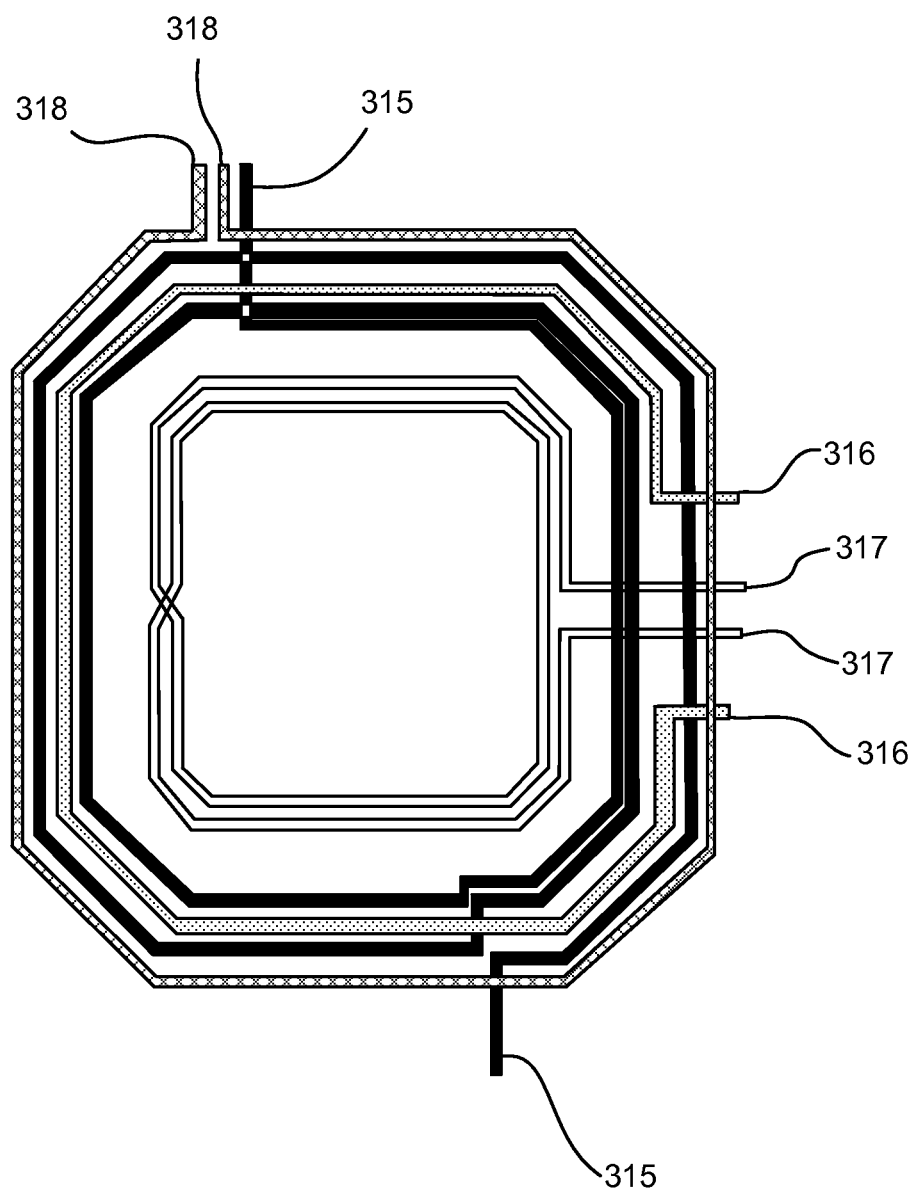
FIG. 4 shows an example of an inductive coupler, in accordance with some embodiments.

FIG. 4 shows an example inductive coupler 250, in accordance with some embodiments. Inductive coupler 250 includes inductors 315-318 of FIG. 3 provided in a concentric arrangement. Inductors 315-318 may each have different trace widths and/or numbers of turns to determine an associated impedance and/or inductance. Inductor 315 (coupled to amplifier 210 in FIG. 3) is depicted as a solid black line. Inductor 316 (coupled to amplifier 215 in FIG. 3) is depicted as a dotted line. Inductor 317 (coupled to amplifier 216 in FIG. 3) is depicted as a white (outlined in black) line. Inductor 318 (coupled to power detector 240 in FIG. 3) is depicted as a crosshatched line. Other embodiments of inductive coupler 250 may have different arrangements of inductors and numbers of turns compared to the inductors shown in FIG. 4. In some embodiments, input coupling block 205 may be implemented with similarly arranged inductors.

Figure 5:
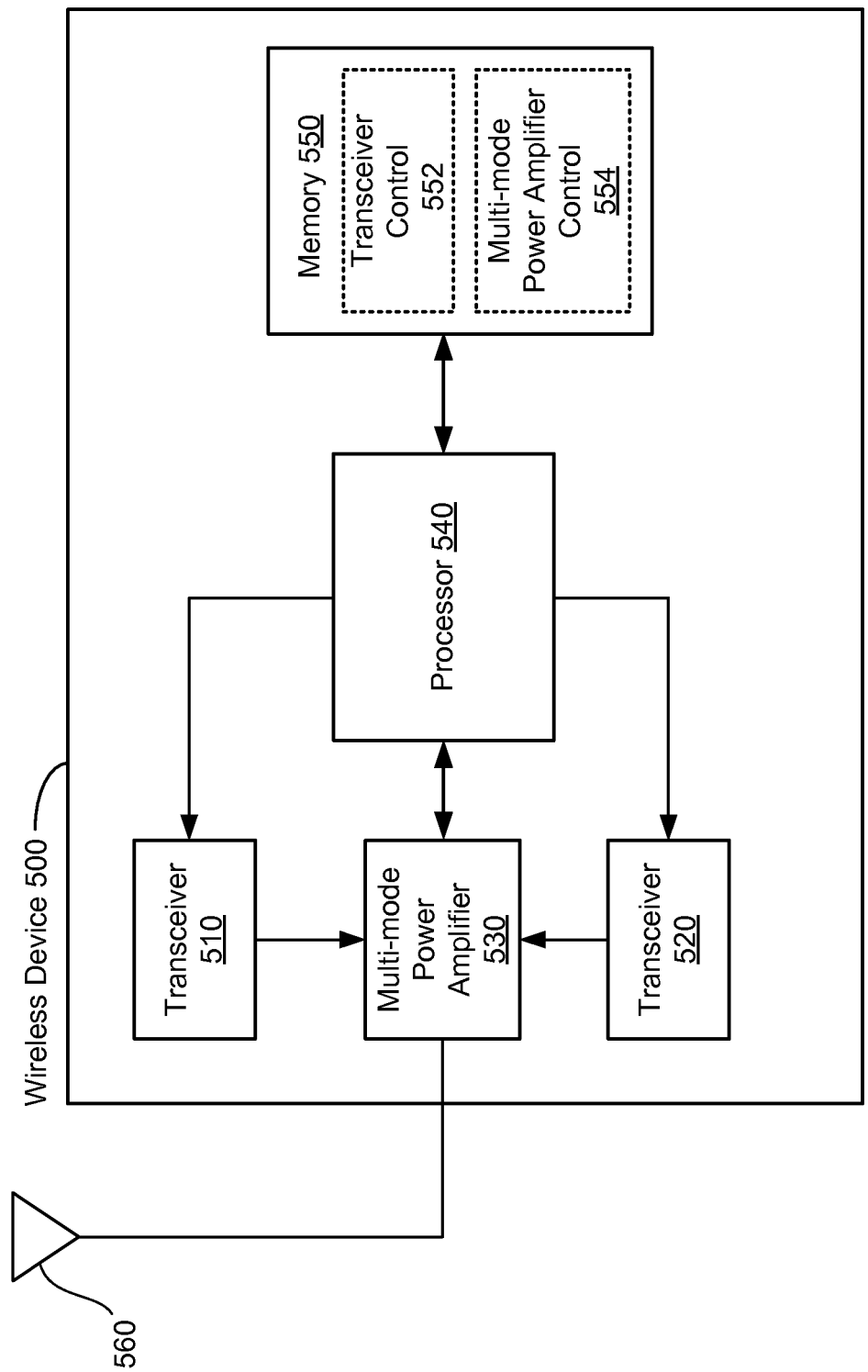
FIG. 5 shows a wireless device that is one embodiment of wireless devices of FIG. 1.

FIG. 5 shows wireless device 500 that is one embodiment of wireless device 105 and/or 110 of FIG. 1. Wireless device 500 includes a first transceiver 510, a second transceiver 520, a multi-mode power amplifier 530, a processor 540, a memory 550, and an antenna 560. Transceivers 510 and 520 may transmit and receive communication signals. Multi-mode power amplifier 530 is coupled to transceiver 510 and transceiver 520, and may amplify communication signals provided by transceivers 510 and 520. For some embodiments, multi-mode power amplifier 530 is multi-mode power amplifier 140 of FIG. 3.

Memory 550 may include a non-transitory computer-readable storage medium (e.g., one or more nonvolatile memory elements, such as EPROM, EEPROM, Flash memory, a hard drive, etc.) that may store the following software modules:
  transceiver control module 552 to control transceivers 510 and 520 to transmit and receive communication signals in accordance with one or more communication protocols, and
  multi-mode power amplifier control module 554 to select and/or amplify one or more communication signals from transceivers 510 and 520, and to provide the amplified communication signal to antenna 560.
Each software module includes program instructions that, when executed by processor 540, may cause wireless device 500 to perform the corresponding function(s). Thus, the non-transitory computer-readable storage medium of memory 550 may include instructions for performing all or a portion of the operations of FIG. 6.

Processor 540, which is coupled to transceivers 510 and 520, multi-mode power amplifier 530, and memory 550, may be any suitable processor capable of executing scripts or instructions of one or more software programs stored in wireless device 500 (e.g., within memory 550).

Processor 540 may execute transceiver control module 552 to configure transceivers 510 and 520 to receive and/or transmit communication signals in accordance with a communication protocol. In some embodiments, transceivers 510 and 520 may each operate according to different communication protocols.

Processor 540 may execute multi-mode power amplifier control module 554 to select a communication signal from transceivers 510 and 520, determine a desired transmit output power, configure multi-mode power amplifier 530 to amplify the selected communication signal to the desired transmit output power, and/or couple the amplified communication signal to the antenna 560.

Figure 6:
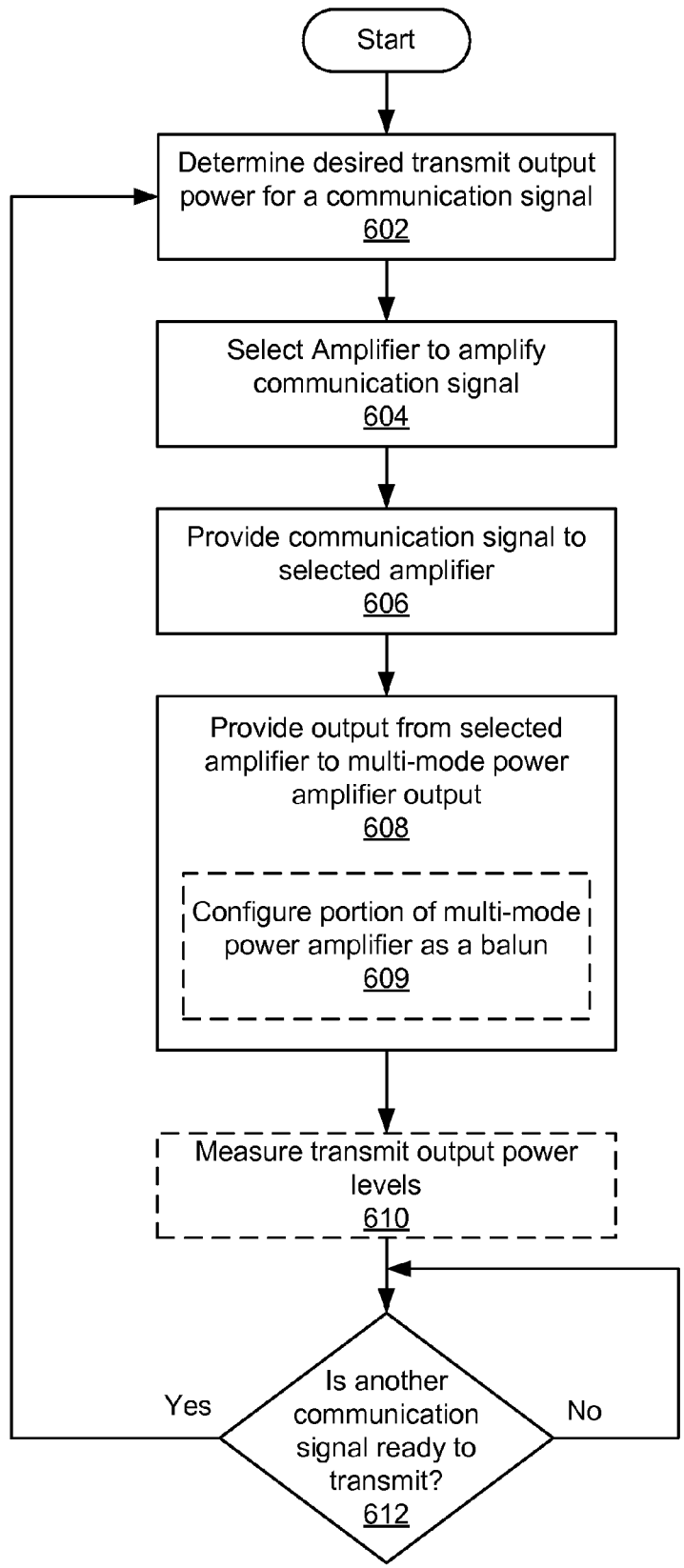
FIG. 6 shows an illustrative flow chart depicting an example operation for transmitting a communication signal in accordance with the present embodiments.

FIG. 6 shows an illustrative flow chart depicting an example operation 600 for transmitting a communication signal in accordance with the present embodiments. Some embodiments may perform the operations described herein with additional operations, fewer operations, operations in a different order, operations in parallel, and/or some operations differently. Referring also to FIGS. 1 and 2, wireless device 105 determines a desired transmit output power to transmit a communication signal (602). In some embodiments, wireless device 105 may determine the desired transmit output power based, at least in part, on the communication signal to be transmitted. For example, a BLUETOOTH communication signal may have a relatively low transmit output power, while a Wi-Fi communication signal may have a relatively moderate or relatively high transmit output power. The desired transmit output power may also be determined by operating conditions, received signal strength, link budget or other technically feasible means.

Next, wireless device 105 selects an amplifier to amplify the communication signal (604). In some embodiments, wireless device 105 may select an amplifier within the multi-mode power amplifier 140 based, at least in part, on the desired transmit output power. As described above, for some embodiments, amplifiers within multi-mode power amplifier 140 may be designed to operate more efficiently for a selected transmit output power or a selected range of transmit output power levels (e.g., as compared with other non-selected transmit output power levels). Thus, wireless device 105 may select a particular amplifier that operates with a relatively high efficiency with respect to the desired transmit output power. For example, if a BLUETOOTH signal is to be amplified by wireless device 105 and amplifier 210 is designed to operate efficiently for BLUETOOTH transmit output power levels, then amplifier 210 may be selected to transmit the BLUETOOTH signal. On the other hand, if a Wi-Fi signal is to be amplified by wireless device 105 and amplifiers 215 and 220 are designed to operate efficiently for Wi-Fi transmit output power levels, then amplifier 215 or amplifier 220 may be selected to transmit the Wi-Fi signal.

Next, wireless device 105 provides the communication signal to the selected amplifier (606). As described above, wireless device 105 may provide the communication signal through input coupling block 205 to the selected one of amplifiers 210, 215, and 220 within multi-mode power amplifier 140. Next, wireless device 105 provides an output signal from the selected amplifier to the output of multi-mode power amplifier 140 (608). As described above, output signals from amplifiers 210, 215, and/or 220 may be provided through output coupling block 230 and/or inductive coupler 250 to the output of the multi-mode power amplifier 140. For example, if amplifier 210 was selected at 604 (e.g., to amplify a BLUETOOTH signal), then amplifier 210 may operate in the first mode to provide the communication signal to the output of multi-mode power amplifier 140. The amplifier enable signal and the $V_{BALUN}$ signal may cause transistors 301 and 302 to operate as an inverting amplifier and may also cause inductor 315 to operate as an output inductor (e.g., to couple the inverting amplifier to the output of the multi-mode power amplifier 140). In another example, if amplifier 215 or 220 was selected at 604 (e.g., to amplify a Wi-Fi signal), then amplifier 210 may operate in the second mode to couple the output of amplifier 215 or 220 to the output of multi-mode power amplifier 140. The amplifier enable signal and the $V_{BALUN}$ signal may cause transistors 301 and 302 to disable the inverting amplifier and couple the output of amplifier 215 or 220 to the output of multi-mode amplifier 140.

Next, in some embodiments, a portion of multi-mode power amplifier 140 may be configured as a balun (609). For example, when amplifier 210 operates in the second mode, inductor 315 may be configured as a balun to provide output signals from amplifiers 215 or 220 to the output of multi-mode power amplifier 140. The amplifier enable signal and the $V_{BALUN}$ signal may cause transistors 301 and 302 couple a terminal of inductor 315 to the first reference voltage and configure inductor 315 as the balun.

Next, in some embodiments, wireless device 105 detects and/or measures the transmit output power levels provided by multi-mode power amplifier 140 (610). As described above, power detector 240 may detect and/or measure output power levels through inductive coupler 250.

Next, wireless device 105 determines if another communication signal is ready to transmit (612). If another communication signal is ready to transmit, then processing continues at 602. If there are no other communication signals ready to transmit, then wireless device 105 waits for another communication signal at 612.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A multi-mode power amplifier to amplify a communication signal, comprising:
   a first amplifier;
   a second amplifier; and
   an inductive coupler coupled between an output of the second amplifier and an output of the multi-mode power amplifier, the inductive coupler comprising:
      a first inductive element including a first terminal coupled to an output of the first amplifier and including a second terminal coupled to the output of the multi-mode power amplifier; and
      a second inductive element coupled across the output of the second amplifier, wherein the first amplifier is to configure the first inductive element to operate as an output inductor that provides the communication signal to the output of the multi-mode power amplifier via the first amplifier during a first mode, and the first amplifier is to configure the first inductive element to operate as a balun that couples the output of the second amplifier to the output of the multi-mode power amplifier during a second mode;
   wherein the first amplifier configures the first inductive element to (i) operate in the first mode by coupling a bias signal to the first amplifier, and (ii) to operate in the second mode by coupling a power supply signal to the first amplifier.

2. The multi-mode power amplifier of claim 1, further comprising a control block to generate a mode select signal based, at least in part, on a desired transmit output power of the multi-mode power amplifier.

3. The multi-mode power amplifier of claim 2, wherein:
   the control block drives the mode select signal to a first state when the desired transmit output power is less than a threshold level; and
   the control block drives the mode select signal to a second state when the desired transmit output power is greater than a threshold level.

4. The multi-mode power amplifier of claim 2, wherein a configuration of the first amplifier is responsive to the mode select signal.

5. The multi-mode power amplifier of claim 1, further comprising a control block to generate a mode select signal based, at least in part, on a protocol type of the communication signal.

6. The multi-mode power amplifier of claim 1, wherein:
   during the first mode, the first amplifier is to drive the communication signal to the first terminal of the first inductive element; and
   during the second mode, the first amplifier is to couple the first terminal of the first inductive element to a reference voltage.

7. The multi-mode power amplifier of claim 1, wherein the first amplifier includes a first transistor coupled between a supply voltage and the output of the multi-mode power amplifier and includes a second transistor coupled between the output of the multi-mode power amplifier and ground potential, wherein:
   during the first mode, the first transistor and the second transistor together operate as an inverter; and
   during the second mode, the first transistor isolates the output of the multi-mode power amplifier from the supply voltage and the second transistor couples the first terminal of the first inductive element to ground potential.

8. The multi-mode power amplifier of claim 1, further comprising an input selector to couple the communication signal to the first amplifier during the first mode and to couple the communication signal to the second amplifier during the second mode.

9. The multi-mode power amplifier of claim 1, wherein the inductive coupler is to couple the output of the first amplifier and/or the output of the second amplifier to a power detector.

10. A wireless communication device to amplify a communication signal, the device comprising:
   a first transceiver; and
   a multi-mode power amplifier, coupled to the first transceiver, the multi-mode power amplifier comprising:
      a first amplifier;
      a second amplifier; and
      an inductive coupler coupled between an output of the second amplifier and an output of the multi-mode power amplifier, the inductive coupler comprising:
         a first inductive element including a first terminal coupled to an output of the first amplifier and including a second terminal coupled to the output of the multi-mode power amplifier; and
         a second inductive element coupled across the output of the second amplifier, wherein the first amplifier is to configure the first inductive element to operate as an output inductor that provides the communication signal to the output of the multi-mode power amplifier via the first amplifier during a first mode, and the first amplifier is to configure the first inductive element to operate as a balun that couples the output of the second amplifier to the output of the multi-mode power amplifier during a second mode;
      wherein the first amplifier configures the first inductive element to (i) operate in the first mode by coupling a bias signal to the first amplifier, and (ii) to operate in the second mode by coupling a power supply signal to the first amplifier.

11. The device of claim 10, wherein the multi-mode power amplifier further comprises a control block to generate a mode select signal based, at least in part, on a transmit output power of the multi-mode power amplifier.

12. The device of claim 11, wherein:
    the control block drives the mode select signal to a first state when a desired transmit output power is less than a threshold level; and
    the control block drives the mode select signal to a second state when the desired transmit output power is greater than a threshold level.

13. The device of claim 11, wherein a configuration of the first amplifier is responsive to the mode select signal.

14. The device of claim 10, further comprising a control block to generate a mode select signal based, at least in part, on a protocol type of the communication signal.

15. The device of claim 10, wherein:
    during the first mode, the first amplifier is to drive the communication signal to the first terminal of the first inductive element; and
    during the second mode, the first amplifier is to couple the first terminal of the first inductive element to a reference voltage.

16. The device of claim 10, wherein the first amplifier includes a first transistor coupled between a supply voltage and the output of the multi-mode power amplifier and includes a second transistor coupled between the output of the multi-mode power amplifier and ground potential, wherein:
    during the first mode, the first transistor and the second transistor together operate as an inverter; and
    during the second mode, the first transistor isolates the output of the multi-mode power amplifier from the supply voltage and the second transistor couples the first terminal of the first inductive element to ground potential.

17. The device of claim 10, further comprising an input selector to couple the communication signal to the first amplifier during the first mode and to couple the communication signal to the second amplifier during the second mode.

18. The device of claim 10, wherein the inductive coupler is to couple the output of the first amplifier and/or the output of the second amplifier to a power detector.

19. A method to amplify a communication signal via a multi-mode power amplifier, the method comprising:
    coupling a first inductive element to an output of a first amplifier;
    coupling a second inductive element across an output of a second amplifier;
    configuring the first inductive element, by the first amplifier, to operate as an output inductor that provides the communication signal to an output of the multi-mode power amplifier via the first amplifier during a first mode; and
    configuring the first inductive element, by the first amplifier, to operate as a balun that couples the output from the second amplifier to the output of the multi-mode power amplifier during a second mode;
    wherein the first amplifier configures the first inductive element to (i) operate in the first mode by coupling a bias signal to the first amplifier, and (ii) to operate in the second mode by coupling a power supply signal to the first amplifier.

20. The method of claim 19, further comprising:
    generating a mode select signal based, at least in part on a transmit output power of the multi-mode power amplifier.

21. The method of claim 20, wherein generating the mode select signal comprises:
    driving the mode select signal to a first state when a desired transmit output power is less than a threshold level; and
    driving the mode select signal to a second state when the desired transmit output power is greater than the threshold level.

* * * * *